United States Patent
Lebouitz et al.

(10) Patent No.: US 9,576,824 B2
(45) Date of Patent: Feb. 21, 2017

(54) ETCHING CHAMBER WITH SUBCHAMBER

(75) Inventors: Kyle S. Lebouitz, Pittsburgh, PA (US); Edward F. Hinds, Carrow Hill (GB)

(73) Assignee: SPTS Technologies Limited, Newport (GB)

( * ) Notice: Subject to any disclaimer, the term of this patent is extended or adjusted under 35 U.S.C. 154(b) by 1989 days.

(21) Appl. No.: 11/816,760

(22) PCT Filed: Feb. 22, 2006

(86) PCT No.: PCT/US2006/006090
§ 371 (c)(1),
(2), (4) Date: Sep. 3, 2008

(87) PCT Pub. No.: WO2006/091588
PCT Pub. Date: Aug. 31, 2006

(65) Prior Publication Data
US 2009/0233449 A1     Sep. 17, 2009

Related U.S. Application Data

(60) Provisional application No. 60/655,094, filed on Feb. 22, 2005.

(51) Int. Cl.
*H01L 21/67* (2006.01)
*H01L 21/677* (2006.01)

(52) U.S. Cl.
CPC ... *H01L 21/67069* (2013.01); *H01L 21/67063* (2013.01); *H01L 21/67745* (2013.01); *H01L 21/67751* (2013.01)

(58) Field of Classification Search
CPC ............ H01L 21/68721; H01L 21/68728; H01L 21/6835; H01L 21/68735; H01L 21/6874

USPC .................................................. 118/719, 733
See application file for complete search history.

(56) References Cited

U.S. PATENT DOCUMENTS

| | | | |
|---|---|---|---|
| 4,797,054 A * | 1/1989 | Arii | 414/217 |
| 4,838,978 A | 6/1989 | Sekine et al. | |
| 4,842,683 A * | 6/1989 | Cheng et al. | 156/345.37 |
| 5,002,010 A * | 3/1991 | Weinberg | 118/719 |
| 5,520,743 A | 5/1996 | Takahashi | |
| 5,667,592 A * | 9/1997 | Boitnott et al. | 118/719 |
| 5,883,017 A | 3/1999 | Tepman et al. | |
| 6,455,098 B2 * | 9/2002 | Tran et al. | 427/8 |
| 6,630,053 B2 * | 10/2003 | Yamagishi et al. | 156/345.32 |
| 6,733,593 B1 | 5/2004 | Tanaka et al. | |
| 6,887,337 B2 | 5/2005 | Lebouitz et al. | |

(Continued)

FOREIGN PATENT DOCUMENTS

| | | |
|---|---|---|
| JP | 59066120 | 4/1984 |
| JP | 08255784 | 10/1996 |

(Continued)

*Primary Examiner* — Karla Moore
(74) *Attorney, Agent, or Firm* — McNees Wallace & Nurick LLC

(57) ABSTRACT

In an apparatus for etching a semiconductor wafer or sample (101), the semiconductor wafer or sample is placed on a sample holder (104) disposed in a first chamber (103). The combination of the semiconductor wafer or sample and the sample holder is enclosed within a second chamber (130) inside the first chamber. Gas is evacuated from the second chamber and an etching gas is introduced into the second chamber, but not into the first chamber, to etch the semiconductor wafer or sample.

14 Claims, 7 Drawing Sheets

(56) References Cited

U.S. PATENT DOCUMENTS

| | | | |
|---|---|---|---|
| 7,682,454 B2* | 3/2010 | Sneh ............................. | 118/719 |
| 2002/0036065 A1 | 3/2002 | Yamagishi et al. | |
| 2002/0122885 A1* | 9/2002 | Ahn ......................... | 427/255.28 |
| 2003/0035705 A1* | 2/2003 | Johnson ................ | C23C 14/566 |
| | | | 414/217 |
| 2003/0185715 A1* | 10/2003 | Krivts et al. .................. | 422/104 |
| 2006/0075972 A1* | 4/2006 | Nakashima ......... | C23C 16/4584 |
| | | | 118/729 |

FOREIGN PATENT DOCUMENTS

| | | |
|---|---|---|
| JP | 2001250767 | 9/2001 |
| KR | 20010041872 A | 5/2001 |
| KR | 20020015672 A | 2/2002 |

\* cited by examiner

ETCHING CHAMBER WITH SUBCHAMBER

BACKGROUND OF THE INVENTION

Vapor etching of semiconductor materials and/or substrates is accomplished using gases, such as xenon difluoride. Specifically, in xenon difluoride etching, xenon difluoride gas reacts with solid materials, such as silicon and molybdenum, such that the materials are converted to a gas phase. The removal of these materials is known as etching.

Some of the gases used to perform vapor etching, such as xenon difluoride, can be expensive, hence, waste of this etching gas should be minimized. However, standard production etching systems in the semiconductor industry are typically not optimized to maximize gas utilization. In particular, Modular Equipment Standards Committee (MESC) compatible chambers, which are those which are typically connected in a cluster arrangement around a central robot, inherently have large chamber volumes. This large chamber volume is a result primarily of a side port used to provide access for the wafer. In addition, many MESC compatible chambers can be used for processing of large diameter wafers, e.g., 200 mm diameter wafer, but can also be used to process smaller diameter wafers, e.g., 100 mm diameter wafers. When using the larger chamber to process a smaller wafer, which is a common occurrence in facilities where more than one wafer size is used, further waste of etching gas occurs.

In addition, since MESC compatible chambers have a wafer loading port on one side, the chamber is inherently non-symmetric. Such asymmetry can lead to non-uniform etching of the wafer since the gas is not distributed axisymmetrically about the wafer.

What is, therefore, needed is a chamber such as, without limitation, an MESC compatible etching chamber or other etching chamber with a port on the side for loading, which has a subchamber assembly inside that creates a reduced chamber volume, is desirably axisymmetric shaped, that maximizes utilization of the etching gas and improves wafer etch uniformity.

SUMMARY OF THE INVENTION

The invention is a semiconductor wafer or sample etching system having a first chamber including a loading port for the passage of a semiconductor wafer or sample between an exterior and an interior of the first chamber having a first volume and a vacuum port in communication with the interior of the first chamber. A wafer or sample holder is disposed in the interior of the first chamber for supporting the semiconductor wafer or sample passed through the loading port. A subchamber assembly is disposed within the first chamber. The subchamber assembly is moveable between an open position, wherein the semiconductor wafer or sample passed through the loading port can be loaded on the sample holder, and a closed position, wherein the combination of the subchamber assembly and the first chamber form a second chamber defining a second, smaller volume that includes the sample holder and the vacuum port.

The etching system can include means for lowering and lifting the semiconductor wafer or sample to and from the sample holder.

The means for lowering and lifting can include means for supporting the semiconductor wafer or sample along an edge thereof during the lowering and lifting thereof, a pneumatic or hydraulic mechanism for lowering and lifting the semiconductor wafer or sample, and/or an electric actuator for lowering and lifting the semiconductor wafer or sample.

The etching system can include an etching gas port in the subchamber assembly for the passage of etching gas into the second chamber and means for passing the etching gas to the etching gas port.

Means can be provided for clamping or holding the semiconductor wafer or sample to the sample holder, especially when the subchamber assembly is in the closed position. Means can also be provided for introducing a gas between the semiconductor wafer or sample and the sample holder when the semiconductor wafer or sample is positioned on the sample holder.

A first seal can be disposed between the subchamber assembly and the first chamber for avoiding the passage of gas therebetween when the subchamber assembly is in the closed position. An adaptor ring can be disposed between the subchamber assembly and the first chamber. A second seal can be disposed between the adaptor ring and the first chamber for avoiding the passage of gas therebetween when the subchamber assembly is in the closed position.

The invention is also a method of etching a semiconductor wafer or sample comprising (a) causing a semiconductor wafer or sample to be placed on a sample holder in a first chamber; (b) enclosing the semiconductor wafer or sample on the sample holder within a second chamber inside the first chamber; (c) evacuating gas from the second chamber; and (d) introducing an etching gas into the second chamber but not into the first chamber.

The method can also include clamping the semiconductor wafer or sample to the sample holder and/or introducing a thermally-conductive gas between the semiconductor wafer or sample and the sample holder.

The first chamber can have a first volume and the second chamber can have a second, smaller volume that is coextensive with the first volume.

Lastly, the invention is a semiconductor wafer or sample etching system that includes a first chamber, a sample holder in the first chamber, and a subchamber assembly inside the first chamber. The subchamber assembly can be moved between a first position that permits introduction or removal of a semiconductor wafer or sample onto or from the sample holder and second position, wherein the combination of the subchamber assembly and the first chamber define an enclosed second chamber inside the first chamber.

Means can be provided for lowering and lifting the semiconductor wafer or sample to and from the sample holder. The means for lowering and lifting can include means for supporting the semiconductor wafer or sample along an edge thereof during the lowering and lifting thereof, a pneumatic or hydraulic mechanism for lowering and lifting the semiconductor wafer or sample semiconductor wafer or sample, and/or an electric actuator for lowering and lifting the semiconductor wafer or sample.

Means can also be provided for passing etching gas into the second chamber, but not the first chamber.

Means can also be provided for holding the semiconductor wafer or sample to the sample holder, especially when the subchamber assembly is in the closed position.

Means can also be provided for introducing a gas between the semiconductor wafer or sample and the sample holder when the semiconductor wafer or sample is positioned on the sample holder.

At least one seal can be disposed between the subchamber assembly and the first chamber for avoiding the passage of gas therebetween when the subchamber assembly is in the closed position. An adaptor ring can be disposed between the subchamber assembly and the first chamber, whereupon the subchamber assembly in the closed position contacts the adaptor ring which, in turn, contacts the first chamber.

DETAILED DESCRIPTION OF THE INVENTION

The present invention will be described with reference to the accompanying figures, where like reference numbers correspond to like elements.

Figure 1:
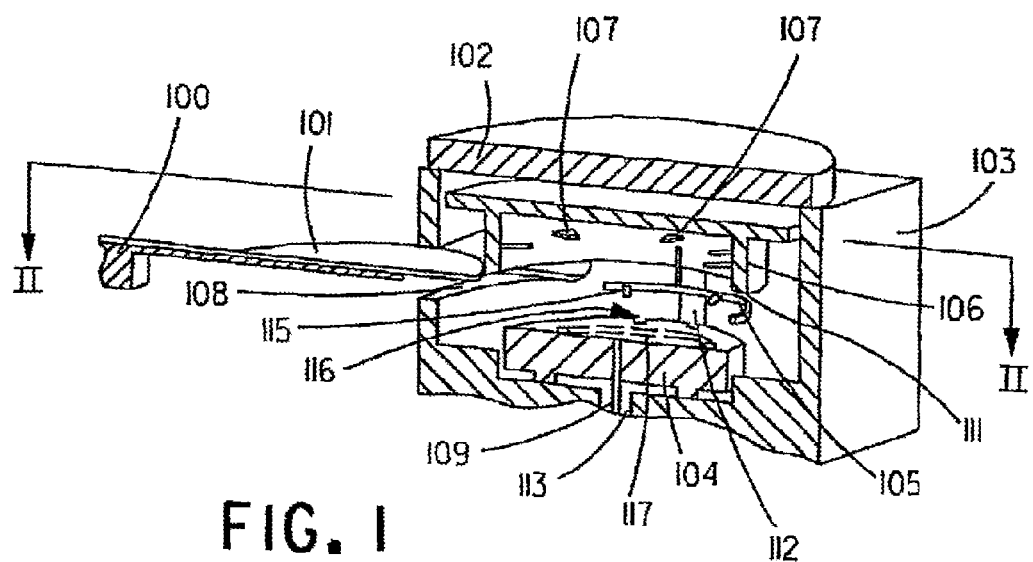
FIG. 1 is a cross-sectional perspective view of prior art MESC compatible chamber block and lid including therein a subchamber assembly in accordance with the present invention.

With reference to FIG. 1, a MESC compatible or other side-loaded etching chamber includes a chamber block 103 and a lid 102. Chamber block 103 includes a sample loading port 108 and a vacuum port 113 which can be coupled to a suitable source of vacuum, e.g., vacuum pump 128 in FIG. 3, which is operative for drawing a vacuum on an interior of chamber block 103. The interior of chamber block 103 defines a first volume.

Also shown are a sample loading arm 100, with a semiconductor wafer or sample 101, a subchamber assembly 106 having a gas inlet port 110 in a lid thereof, one or more optional sample clamping tabs 107, a sample lifting means 105 and a subchamber seal 111. The illustration of gas inlet port 110 in the lid of subchamber assembly 106 is not to be construed as limiting the invention.

Figure 4:
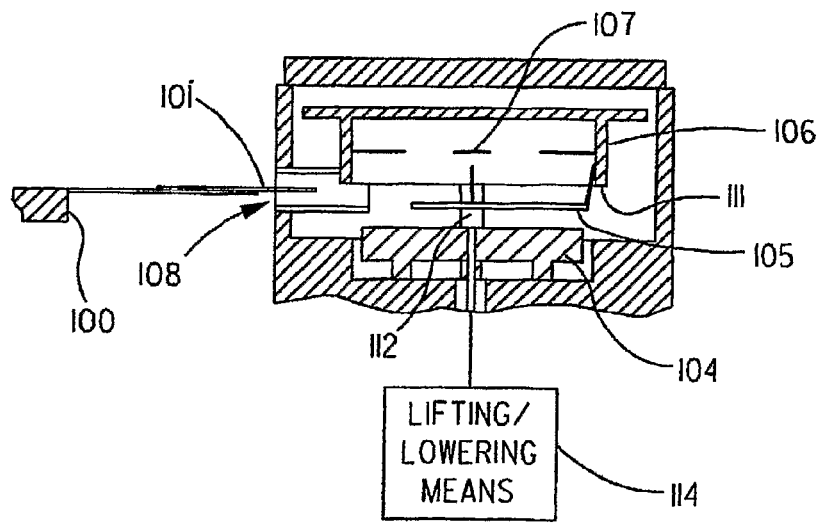
FIGS. 4-8 are cross-sectional views of the chamber block and subchamber assembly shown in FIG. 1 showing the progressive loading of a semiconductor wafer or sample on a sample holder thereof and the formation of a sealed chamber around the sample holder with the semiconductor wafer or sample loaded thereon.

A lifting mechanism 112 is desirably coupled between chamber block 103 and a lifting/lowering means 114, shown in FIG. 4, which is operative for raising and lowering subchamber assembly 106, and any components attached thereto, via lifting mechanism 112. As shown best in FIGS. 2 and 9, lifting mechanism 112 desirably comprises a pair of rods coupled between subchamber assembly 106, desirably a lid of subchamber assembly 106, and lifting/lower means 114 via a pair of slide channels defined through a floor of chamber block 103. A suitable gas tight seal (not shown) can be disposed between each rod and its corresponding slide channel to avoid the passage of gas thereby. The illustration of lifting mechanism 112 comprising a pair of rods slideable in slide channels, however, is not to be construed as limiting the invention since it is envisioned that lifting mechanism 112 can be implemented in any manner deemed suitable and/or desirable by one of ordinary skill in the art.

In addition, FIG. 1 also shows a sample holder 104, such as, without limitation, a wafer chuck, desirably temperature controlled, with an optional gas connection 109. Gas connection 109 is configured for introducing a thermal conduction gas, such as helium, between sample 101 and sample holder 104 when sample 101 is positioned on sample holder 104 to improve thermal conduction therebetween. To avoid the escape of this thermal conduction gas from between sample 101 positioned on sample holder 104, a flexible gas seal 117, shown in phantom in FIG. 1, can be disposed between sample 101 positioned on sample holder 104.

Figure 2:
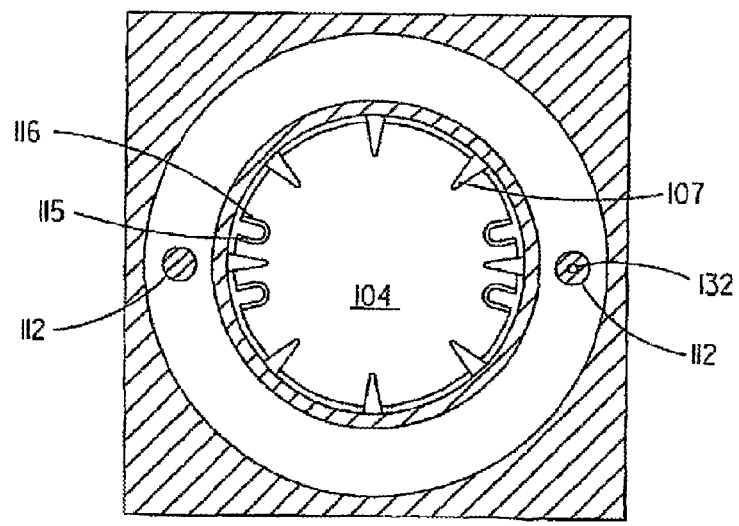
FIG. 2 is a sectional view taken along line II-II in FIG. 1.

With reference to FIG. 2, sample holder 104 includes notches 116 defined therein and sample lifting means 105 includes corresponding tabs 115. When sample lifting means 105 is lowered toward sample holder 104 in the manner to be described hereinafter, tabs 115 defined on sample lifting means 105 are received in notches 116 defined in or through sample holder 104. Tabs 115 provide wafer lift capability known as edge lift.

Figure 3:
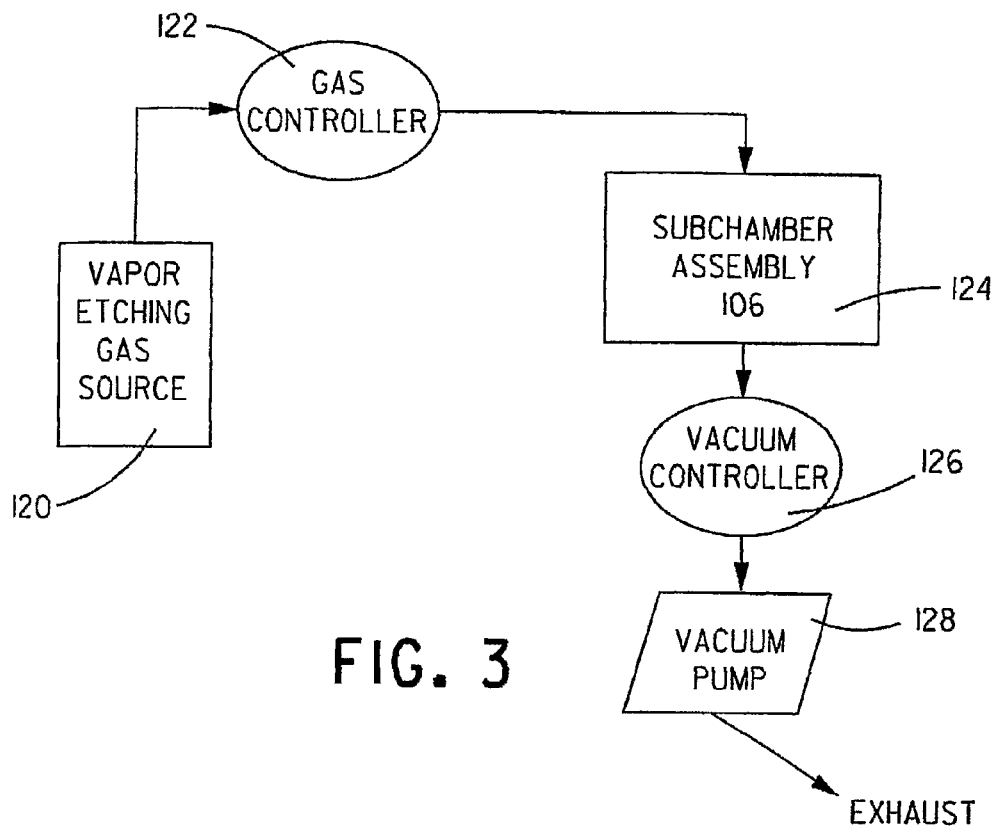
FIG. 3 is a block diagram of a flow of etching gas through the subchamber assembly shown in FIG. 1.

With reference to FIG. 3, etching gas flows from a source container 120, through a gas control 122, e.g., a valve, a series of valves, a pressure controller, an intermediate expansion chamber of any of the types disclosed in U.S. Pat. No. 6,887,337 to Lebouitz et al., which is incorporated herein by reference, a flow controller, or any combination of these components, through subchamber assembly 106 (block 124), which, in combination with chamber block 103, can form a sealed chamber 130 (shown best in FIGS. 8 and 9), through a vacuum controller 126, which may be a valve, a series of valves, a pressure controller, a flow controller or any combination of these components, and then through a vacuum pump 128.

With reference to FIGS. 4-8, a sequence of loading, processing, and unloading sample 101 will now be described.

FIG. 4 shows subchamber assembly 106, sample lifting means 105, subchamber seal 111, wafer clamping tabs 107 and lifting mechanism 112 raised into a load or open position via lifting/lowering means 114, such as, without limitation, a suitable pneumatic or hydraulic mechanism or an electric actuator. In the illustrated embodiment, sample lifting means 105, subchamber assembly seal 111 and wafer clamping tabs 107 are coupled to subchamber assembly 106 which, in turn, is coupled to lifting mechanism 112. However, this is not to be construed as limiting the invention since it is envisioned that sample lifting means 105 and wafer clamping tabs 107 can be coupled to lifting mechanism 112 in any suitable and/or desirable manner. Moreover, it is envisioned that subchamber assembly seal 111 can alternatively be located on the mating face of a floor of chamber block 103 where the lower end of subchamber assembly 106 contacts to form the sealed chamber 130, shown best in FIGS. 8 and 9. In FIG. 4, sample 101 is shown positioned between subchamber assembly seal 111 and sample lifting means 105 outside the periphery of subchamber assembly seal 111 by sample loading arm 100.

Figure 5:
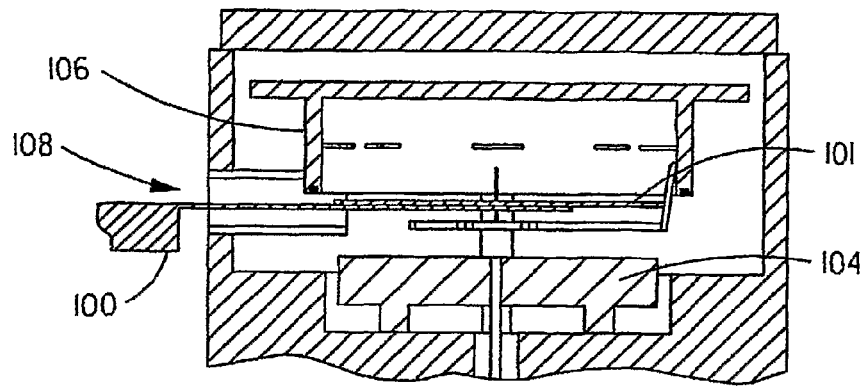

With reference to FIG. 5, at a suitable time, sample 101 is positioned beneath, desirably concentric, with subchamber assembly 106 by sample loading arm 100.

Figure 6:
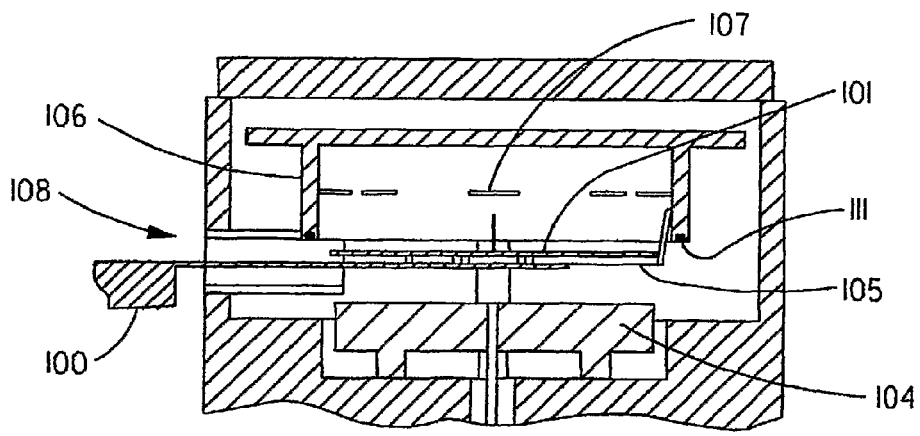

FIG. 6 shows sample loading arm 100 in the same position as in FIG. 5 but with subchamber assembly 106, sample lifting means 105, subchamber seal 111, and wafer clamping tabs 107 moved by lifting/lowering means 114 via lifting mechanism 112 in a vertical direction away from sample holder 104, whereupon tabs 115 of sample lifting means 105 lift sample 101 off of sample loading arm 100 via the edge of sample 101. This lifting action is helpful in that sample loading arm 100 does not need to have vertical motion capability.

Figure 7:
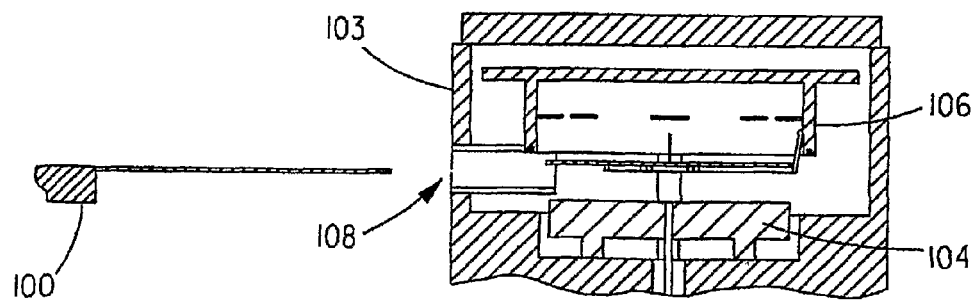

With reference to FIG. 7, once sample 101 has been lifted off of sample loading arm 100 by tabs 115 of wafer lift ring 105, wafer arm 100 is retracted from chamber block 103.

Figure 8:
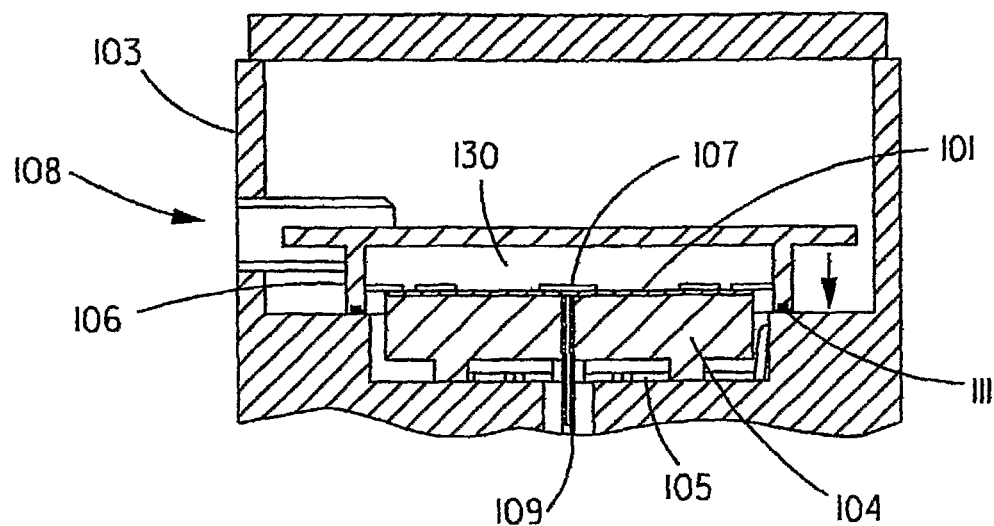

With reference to FIG. 8, after wafer arm 100 has been retracted from chamber block 103, subchamber assembly 106, sample lifting means 105, subchamber seal 111, wafer clamping tabs 107 and lifting mechanism 112 are lowered by lifting/lowering means 114 whereupon sample 101 is deposited on sample holder 104 and sealed chamber 130 is formed having a second, smaller volume within the first volume defined by chamber block 103. Ordinarily, chamber block 103 includes a door (not shown) for closing and sealing loading port 108 after sample 101 has been loaded onto sample holder 104.

During lowering of subchamber assembly 106, tabs 115 are received in notches 116 and wafer clamping tabs 107, if present, press against sample 101 to clamp it against sample holder 104. This clamping improves the thermal contact between sample 101 and sample holder 104 to aid controlling the temperature of sample 101 during etching. In one non-limiting embodiment, sample clamping tabs 107 are flexible and have a spring memory in a vertical direction whereupon they can clamp sample 101 to sample holder 104 with spring force related to the diameter and thickness of sample 101. However, this is not to be construed as limiting the invention.

Adding a thermally-conductive gas, such as helium, through gas connection 109 when sample 101 is loaded on sample holder 104 can further improve thermal conduction between sample 101 and sample holder 104. Clamping sample 101 to sample holder 104 also avoids etching gas from reaching the rear of sample 101.

Figure 9:
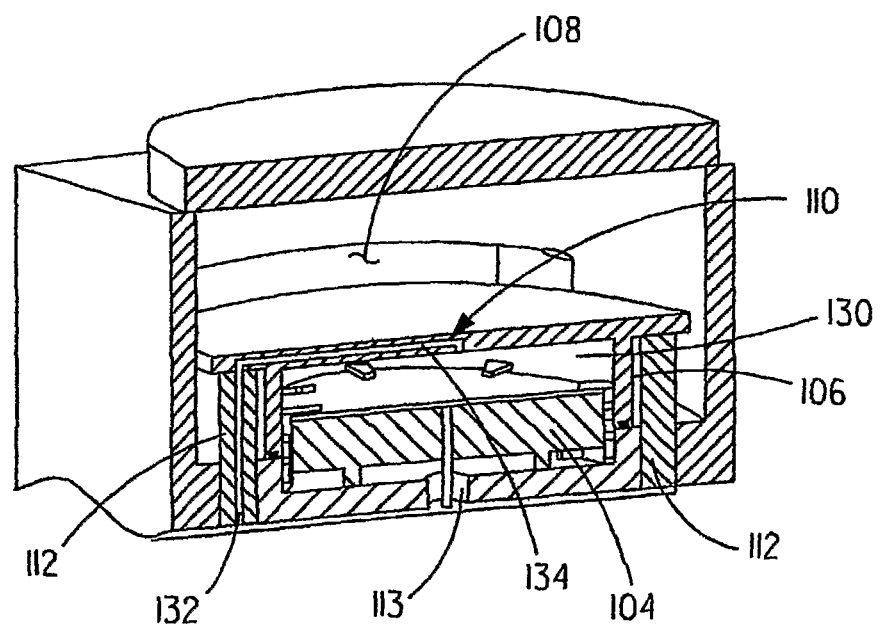
FIG. 9 is a cross-sectional perspective view of the semiconductor wafer or sample positioned on the sample holder of the sealed chamber shown in FIG. 8 including vertical and horizontal channels in fluid communication with a port of the subchamber assembly for the introducing of etchant gas into the sealed chamber.

Once sealed chamber 130 has been formed, gas is evacuated from sealed chamber 130 by the operation of vacuum pump 128 via vacuum port 113. Thereafter, etching of sample 101 can proceed by flowing vapor etching gas through port 110 into sealed chamber 130. FIG. 9 shows one non-limiting embodiment wherein etching gas flows through a vertical channel 132 defined in a rod of lifting mechanism 112 in direct fluid communication with a horizontal channel 134 in the lid of subchamber assembly 106 before exiting port 110.

Once sample 101 has been etched by etching gas to a desired extent, sample 101 is removed from the etching chamber by reversing the procedures used to load sample 101 on sample holder 104.

Figure 10:
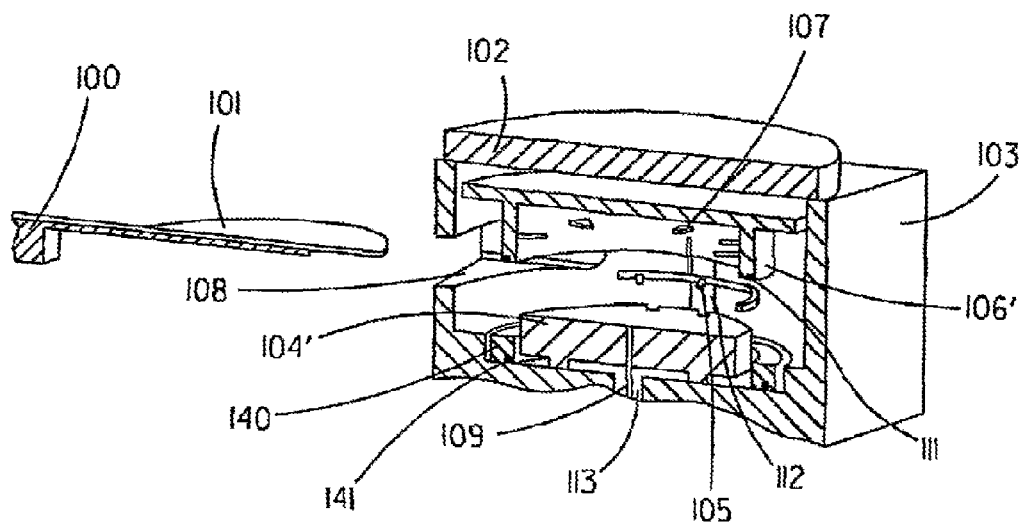
FIG. 10 is a cross-sectional perspective view of another embodiment of the chamber block including the subchamber assembly and an adaptor ring, with the subchamber assembly in the open position.

With reference to FIG. 10, when chamber block 103 is designed to handle large wafers 101, it can be readily modified to accommodate smaller wafers. More specifically, FIG. 10 shows that a reduced volume subchamber assembly 106N is easily implemented maximizing the utilization of etching gas. This reduced volume subchamber assembly 106N includes appropriately sized components, such as, without limitation, sample lifting means 105, subchamber seal 111, wafer clamping tabs 107, and lifting mechanism 112. A reduced-sized sample holder 104' can also be employed in combination with an optional adaptor sealing ring 140 mounted on a floor of chamber block 103 around sample holder 104'. Adaptor ring 140 includes around the base thereof a seal 141 configured to engage the floor of chamber block 103 to form a seal between adaptor ring 140 and the floor of chamber block 103 to avoid the passage of etching gas from sealed chamber 130.

Figure 11:
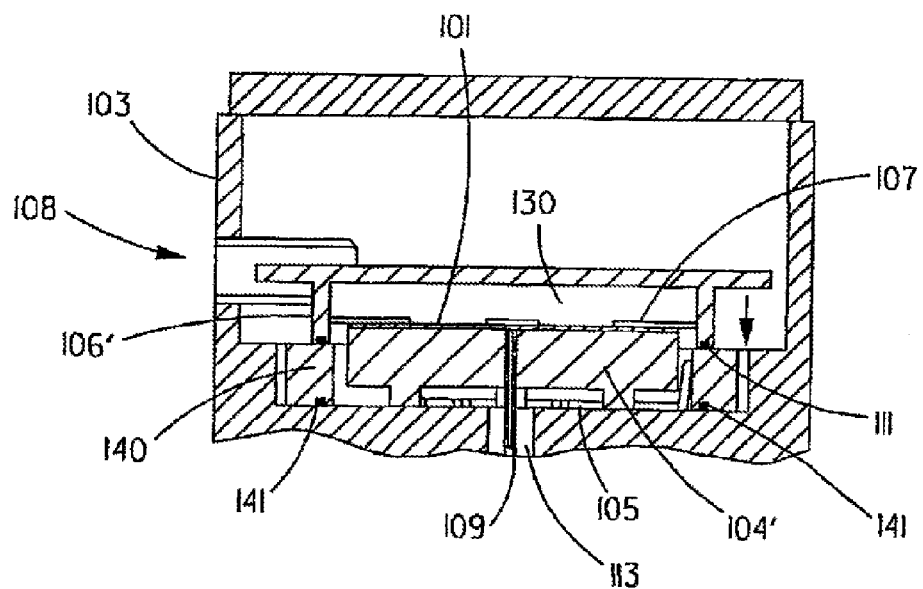
FIG. 11 is a cross-sectional view of the chamber block and subchamber assembly shown in FIG. 10, with the subchamber assembly in the closed position against the adaptor ring.

FIG. 11 shows a cross section of the chamber block 103 shown in FIG. 10 looking directly from the side with subchamber assembly 106 in the closed position pressing subchamber seal 111 into contact with a top surface of adaptor ring 140 and, thereby, pressing seal 141 into contact with the floor of chamber block 103 to form seals therebetween that avoid the passage of etching gas from sealed chamber 130.

Figure 12:
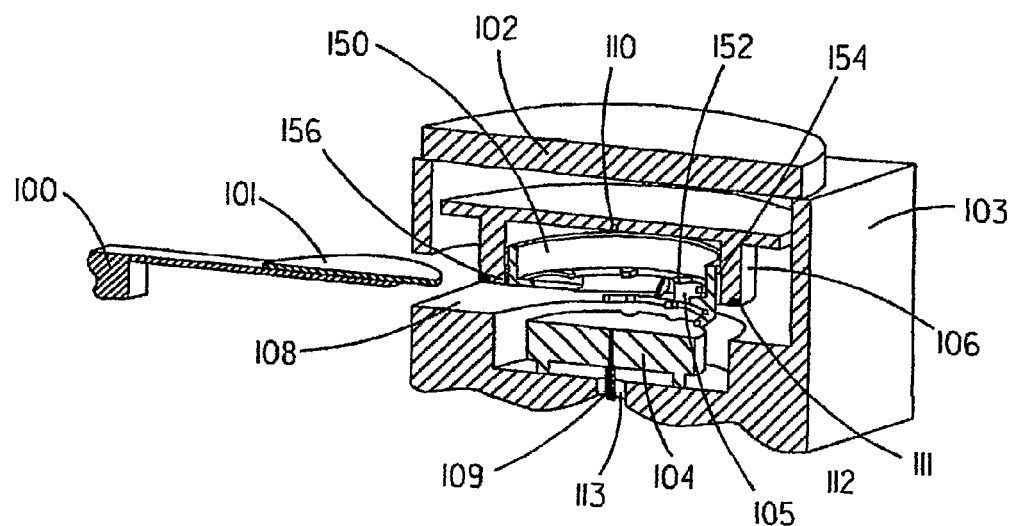
FIG. 12 is a cross-sectional perspective view of the chamber block and subchamber assembly, wherein the wafer clamping tabs utilized to clamp the semiconductor wafer or sample to the sample holder shown in FIG. 8 are replaced with a weight and clamping fingers.
Figure 13:
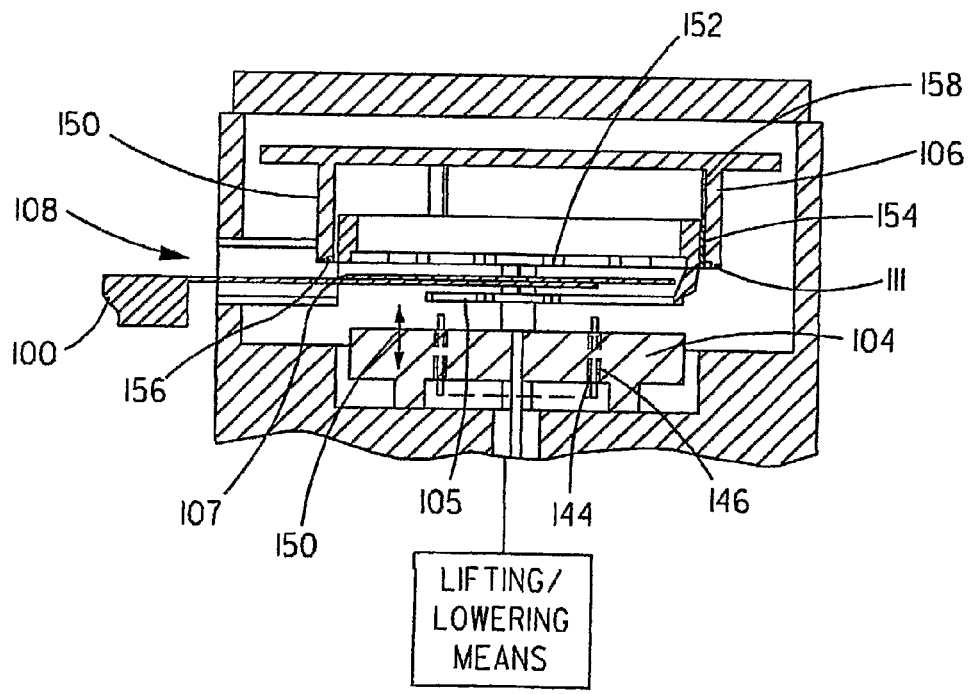
FIG. 13 is a cross-sectional view of the chamber block and subchamber assembly shown in FIG. 12, with the semiconductor wafer or sample positioned for loading onto the sample holder.
Figure 14:
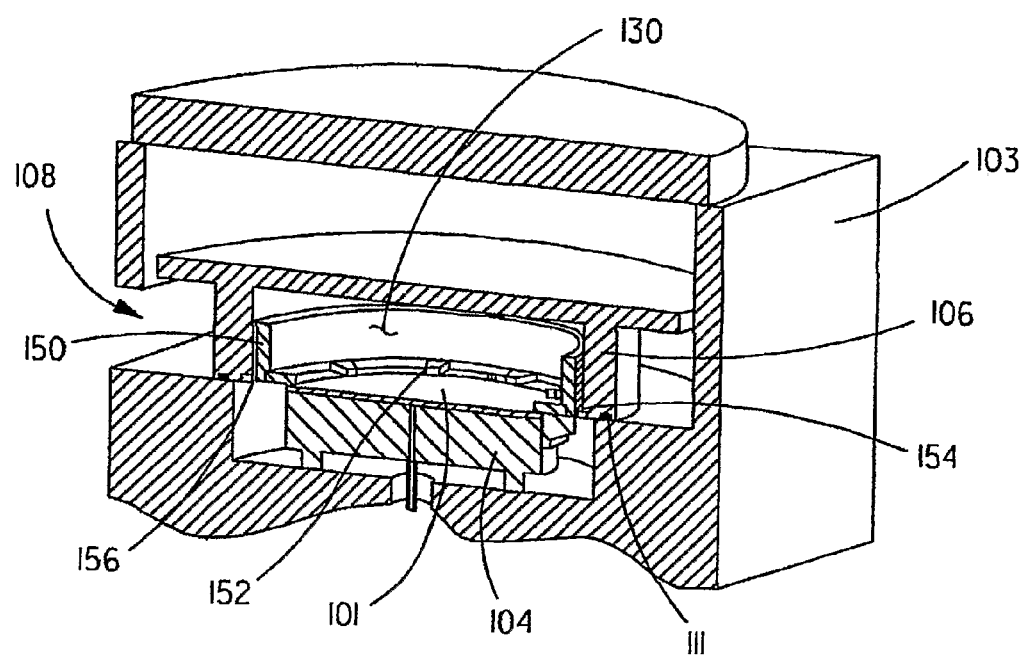
FIG. 14 is a cross-sectional perspective view of the chamber block and subchamber assembly of FIGS. 12 and 13, with the semiconductor wafer or sample positioned on the sample holder in the sealed chamber formed by the subchamber assembly in the closed position.

FIGS. 12-14 show another means for clamping semiconductor wafer or sample 101 to sample holder 104 by way of a weight 150. Weight 150 provides the necessary downward force to clamp sample 101 to sample holder 104 via clamping fingers 152 arranged around an inner periphery of weight 150. An advantage of using weight 150 for clamping is that the clamping force will be independent of wafer diameter, which is typically not the case when using a spring-based clamping design, e.g., wafer clamping tabs 107.

Weight 150 is able to move vertically inside of the subchamber assembly 106 so that clamping fingers 152 can apply a downward force on sample 101. In this embodiment, vertical sliding motion between weight 150 and subchamber assembly 106 is accomplished via slides 154 which are distributed between weight 150 and subchamber assembly 106 and which are accommodated by grooves 158 in subchamber assembly 106. The downward motion of weight 150 is restricted by a retaining ring 156 which, thereby, enables weight 150 to be raised and lowered from and to sample holder 104 in concert with the raising and lowering of subchamber assembly 106 by lifting/lowering means 114. As shown in FIG. 14, when subchamber assembly 103 and weight 150 are lowered toward sample 101 positioned on sample holder 104, slides 154 enable subchamber assembly 103 to move subchamber seal 111 into contact with a floor of chamber block 103 after clamping fingers 152 of weight 150 have engaged a top surface of sample 101, thereby clamping sample 101 to sample holder 104.

The invention has been described with reference to the preferred embodiments. Obvious modifications and alterations will occur to others upon reading and understanding the preceding detailed description. For example, sample lifting means 105 can be replaced by other suitable means, such as so-called wafer lift pins 144, shown in phantom in FIG. 13, slidably received in channels 146 formed in sample holder 104 and coupled to lifting/lowering means 114. Under the control of lifting/lowering means 114, the vertical motion of these wafer lift pins 144, shown by two headed arrow 148 in FIG. 13, can be controlled to raise and lower sample 101 away and toward sample holder 104 during loading and unloading of sample 101 on sample holder 104. Alternatively, sample lifting means 105 can be replaced by a single, central pedestal or post (not shown) slidably received in a channel formed centrally in sample holder 104 and having a diameter sufficient for supporting sample 101 during the raising and lowering thereof. Moreover, the description herein of clamping tabs 107 and clamping fingers 152 for clamping semiconductor wafer or sample to sample holder 104 is not to be construed as limiting the invention since it is envisioned that any other suitable and/or desirable mechanical clamping means, such as a clamping ring, or electrostatic clamping means may also or alternatively be used for hold semiconductor wafer or sample 101 to sample holder 104. It is intended that the invention be construed as including all such modifications and alterations insofar as they come within the scope of the appended claims or the equivalents thereof.

The invention claimed is:

1. A semiconductor wafer or sample etching system comprising:
   a first chamber having a loading port for passage of a semiconductor wafer or sample between an exterior and an interior of the first chamber, and a vacuum port in communication with the interior of the first chamber, wherein the interior of the first chamber defines a first volume;
   a sample holder mounted on a floor of the first chamber and disposed in the interior of the first chamber for supporting the semiconductor wafer or sample passed through the loading port;
   a sample lift mechanism for lowering and lifting the semiconductor wafer or sample to and from the sample holder; and
   a subchamber assembly disposed within the first chamber, the subchamber assembly moveable by a lifting/lowering mechanism with respect to the sample holder, which is stationary during movement of the subchamber assembly, between an open position where the subchamber assembly is lifted for sample loading, wherein the semiconductor wafer or sample passed through the loading port can be loaded on the sample holder, and a closed position where the subchamber assembly is lowered, wherein the combination of the subchamber assembly and the first chamber form a second chamber defining a second, smaller volume that includes the sample holder and the vacuum port therein, and wherein the sample lift mechanism is coupled to the subchamber assembly and arranged to move with the subchamber assembly.

2. The etching system of claim 1, wherein the lifting/lowering mechanism includes at least one of:
   tabs for supporting the semiconductor wafer or sample along an edge thereof during the lowering and lifting thereof;
   a pneumatic or hydraulic mechanism for lowering and lifting the semiconductor wafer or sample; and
   an electric actuator for lowering and lifting the semiconductor wafer or sample.

3. The etching system of claim 1, further including:
   an etching gas port in the subchamber assembly for passage of etching gas into the second chamber; and
   a pump for passing the etching gas to the etching gas port.

4. The etching system of claim 1, further including a spring-based clamping mechanism or weights for holding the semiconductor wafer or sample to the sample holder.

5. The etching system of claim 1, further including a gas connection for introducing a gas between the semiconductor wafer or sample and the sample holder when the semiconductor wafer or sample is positioned on the sample holder.

6. The etching system of claim 1, further including a first seal disposed between the subchamber assembly and the first chamber for avoiding the passage of gas therebetween when the subchamber assembly is in the closed position.

7. The etching system of claim 6, further including:
   an adaptor ring disposed between the subchamber assembly and the first chamber; and
   a second seal disposed between the adaptor ring and the first chamber for avoiding the passage of gas therebetween when the subchamber assembly is in the closed position.

8. A semiconductor wafer or sample etching system comprising:
   a first chamber;
   a sample holder in the first chamber, the sample holder being mounted on a floor of the first chamber;
   a sample lift mechanism for lowering and lifting the semiconductor wafer or sample to and from the sample holder; and
   a subchamber assembly inside the first chamber, the subchamber assembly moveable by a lifting/lowering mechanism with respect to the sample holder, which is stationary during movement of the subchamber assembly, between a first position where the subchamber assembly is lifted which permits a semiconductor wafer or sample to be placed on or removed from the sample holder and second position where the subchamber is lowered wherein the combination of the subchamber assembly and the first chamber define a second chamber inside the first chamber and the second chamber encloses the sample holder such that the semiconductor wafer or sample cannot be placed on or removed from the sample holder, and wherein the sample lift mechanism is coupled to the subchamber assembly and arranged to move with the subchamber assembly.

9. The etching system of claim 8, wherein the lifting/lowering mechanism includes at least one of:
   tabs for supporting the semiconductor wafer or sample along an edge thereof during the lowering and lifting thereof;
   a pneumatic or hydraulic mechanism for lowering and lifting the semiconductor wafer or sample; and
   an electric actuator for lowering and lifting the semiconductor wafer or sample.

10. The etching system of claim 8, further including a pump for passing etching gas into the second chamber, but not the first chamber.

11. The etching system of claim 8, further including a spring-based clamping mechanism or weights for clamping the semiconductor wafer or sample to the sample holder when the subchamber assembly is in the second position.

12. The etching system of claim 8, further including a gas connection for introducing a gas between the semiconductor wafer or sample and the sample holder when the semiconductor wafer or sample is positioned on the sample holder.

13. The etching system of claim 8, further including at least one seal disposed between the subchamber assembly and the first chamber for avoiding the passage of gas therebetween when the subchamber assembly is in the closed position.

14. The etching system of claim 13, further including an adaptor ring disposed between the subchamber assembly and the first chamber, wherein the subchamber assembly in the closed position contacts the adaptor ring which contacts the first chamber.

* * * * *